United States Patent
Schneidewind et al.

(10) Patent No.: US 7,196,507 B2
(45) Date of Patent: Mar. 27, 2007

(54) APPARATUS FOR TESTING SUBSTRATES

(75) Inventors: Stefan Schneidewind, Reichenberg (DE); Claus Dietrich, Sacka (DE); Frank-Michael Werner, Dresden (DE); Don Feuerstein, Southbury, CT (US); Mike Lancaster, Williston, VT (US); Denis Place, Williston, VT (US)

(73) Assignee: SUSS MicroTec Testsystems (GmbH), Dresden (DE)

( * ) Notice: Subject to any disclaimer, the term of this patent is extended or adjusted under 35 U.S.C. 154(b) by 0 days.

(21) Appl. No.: 10/928,975

(22) Filed: Aug. 27, 2004

(65) Prior Publication Data

US 2005/0083036 A1   Apr. 21, 2005

(30) Foreign Application Priority Data

Mar. 18, 2003 (DE) ...................... 10 2004 013 707
Aug. 28, 2003 (DE) ................. 103 40 006

(51) Int. Cl.
G01R 31/28 (2006.01)

(52) U.S. Cl. .................... 324/158.1; 324/758; 324/765

(58) Field of Classification Search ................ None
See application file for complete search history.

(56) References Cited

U.S. PATENT DOCUMENTS

| | | | | |
|---|---|---|---|---|
| 5,259,881 A * | 11/1993 | Edwards et al. | ............. | 118/719 |
| 5,292,393 A * | 3/1994 | Maydan et al. | ........ | 156/345.32 |
| 5,306,380 A * | 4/1994 | Hiroki | ................... | 156/345.32 |
| 5,310,410 A * | 5/1994 | Begin et al. | ................ | 29/25.01 |
| 5,445,491 A * | 8/1995 | Nakagawa et al. | ......... | 414/805 |
| 5,695,564 A * | 12/1997 | Imahashi | ..................... | 118/719 |
| 5,765,983 A * | 6/1998 | Caveney et al. | ............ | 414/217 |
| 5,766,360 A * | 6/1998 | Sato et al. | ................... | 118/666 |
| 5,837,059 A * | 11/1998 | Glants | ........................ | 118/733 |
| 5,934,856 A * | 8/1999 | Asakawa et al. | ........... | 414/217 |
| 6,037,793 A * | 3/2000 | Miyazawa et al. | .......... | 324/760 |
| 6,301,802 B1* | 10/2001 | Kato et al. | ..................... | 34/406 |
| 6,315,512 B1* | 11/2001 | Tabrizi et al. | .............. | 414/217 |
| 6,339,730 B1* | 1/2002 | Matsushima | ................ | 700/218 |
| 6,395,094 B1* | 5/2002 | Tanaka et al. | .............. | 118/719 |
| 6,413,037 B1* | 7/2002 | Brodine | ..................... | 294/64.1 |
| 6,420,864 B1* | 7/2002 | Abraham et al. | ........ | 324/158.1 |
| 6,522,942 B2* | 2/2003 | Kondo et al. | ............... | 700/218 |
| 6,685,422 B2* | 2/2004 | Sundar et al. | ........... | 414/744.5 |
| 6,833,035 B1* | 12/2004 | Thompson et al. | ........... | 134/33 |
| 2002/0061248 A1* | 5/2002 | Tepman | ................... | 414/744.5 |
| 2003/0073323 A1* | 4/2003 | Kim et al. | .................. | 438/710 |
| 2003/0202865 A1* | 10/2003 | Pennekanti et al. | ......... | 414/217 |

* cited by examiner

*Primary Examiner*—Vinh Nguyen
*Assistant Examiner*—Richard Isla-Rodas
(74) *Attorney, Agent, or Firm*—Baker Botts LLP; Manu J. Tejwani

(57) ABSTRACT

An apparatus for testing substrates reduces the area required and the costs which arise with the testing of substrates, in particular semiconductor wafers, during the production process. The apparatus includes testing arrangements comprising a chuck, a chuck drive, control electronics, probe or probe board holding means with a handling system, a substrate magazine station and an alignment station. The testing arrangements include at least two testing arrangements, both of which are all jointly operatively connected to the handling system, the substrate magazine station and the alignment station.

11 Claims, 4 Drawing Sheets

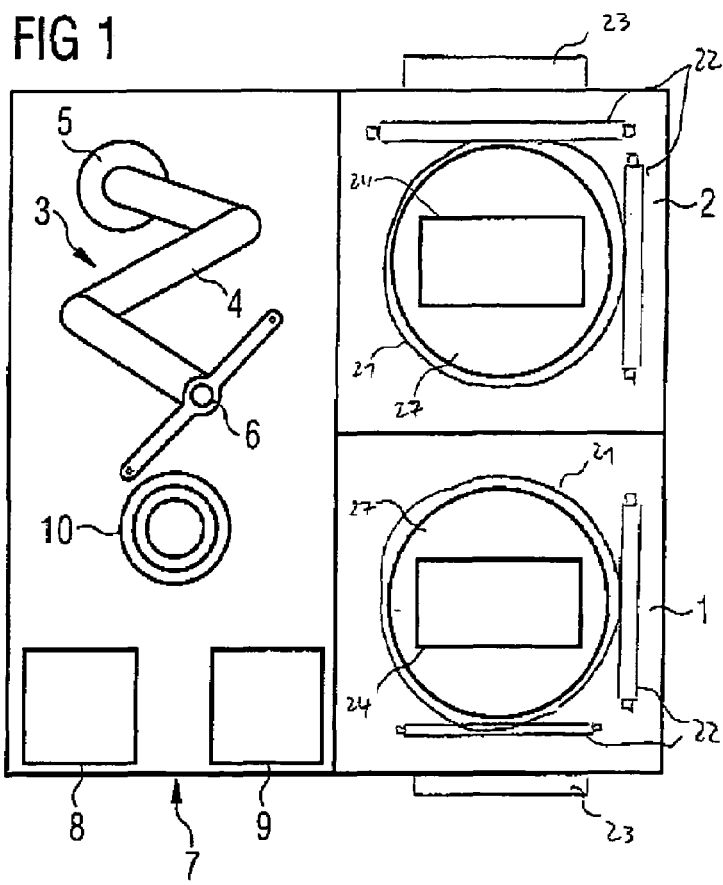
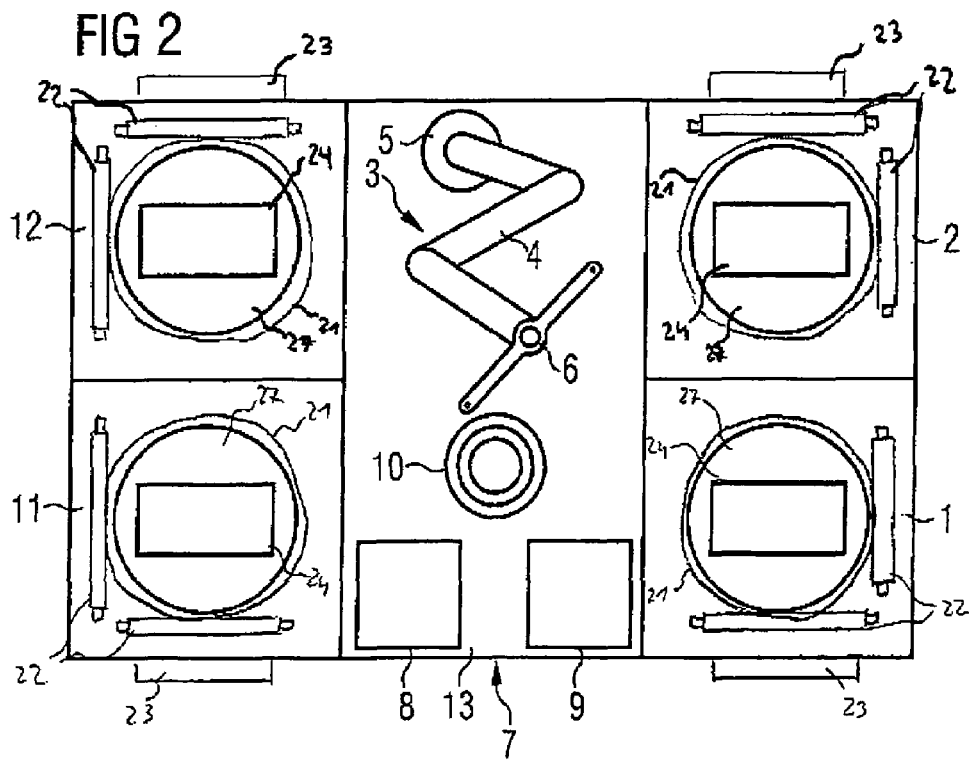

APPARATUS FOR TESTING SUBSTRATES

This application claims priority from German Patent application Nos. DE 103 40 006.4 and DE 10 2004 013 707.2, filed Aug. 28, 2003 and Mar. 18, 2003, respectively, both of which applications are hereby incorporated by reference herein in their entireties.

FIELD OF THE INVENTION

The invention relates to an apparatus for testing substrates with a test arrangement at least comprising a chuck, a chuck drive, control electronics, probe or probe board holding means, with a handling system, a substrate magazine station and an alignment station.

BACKGROUND OF THE INVENTION

It is necessary to test substrates with electrical or electromechanical properties, such as semiconductor wafers, integrated circuits, multichip modules, printed circuit boards, flat displays and the like, during production. For this purpose, use is made of testing apparatuses which make contact with the substrates via probes. These probes are used to apply test signals to the substrates and/or for measuring a reaction of the substrate to the test signals.

In particular, such apparatuses are used for testing substrates in the field of semiconductor production. Here, the designation "prober" will be found. In this case, as a general rule, integrated semiconductor chips are tested in their assembly on a semiconductor wafer, as it is known. Wafers are composed of various materials, such as silicon, GaAs, InP or comparable materials and have a diameter of preferably 2" to 12" and a thickness to the order of magnitude of 90 to 500 μm. Following structuring to the wafers, the semiconductor chips produced in this way are tested and the semiconductor chips are then separated and subsequently finally mounted to form finished components.

In order to ensure the quality of the finished circuits, these have to be tested with suitable probers. The reactions measured in the process to the test signals supply information about the quality of each individual circuit by means of a comparison with the previously defined standards.

The testing in the wafer assembly, that is to say before the separation, is therefore advantageous since, following the separation, the individual chips would be difficult to handle for the testing, and testing could then expediently only be carried out following final mounting. However, this would mean that a not inconsiderable number of chips which do not meet the quality requirements would be finally mounted.

Typically, the semiconductor wafers are mounted and transported in wafer magazines. In this case, as a rule up to 25 semiconductor wafers are held with a vertical spacing from one another in the wafer magazine.

The sensitivity of the semiconductor wafers with regard to fracture and any kind of contamination forbids any contact with the human hand, for which reason handling robots are normally employed, which transport the semiconductor wafer from one processing station to another or transport it in or out of a wafer magazine.

Such a handling robot comprises a robot arm which is attached to a robot drive and, as a result, can be moved in a vertical degree of freedom (z) and two horizontal degrees of freedom (x, y) and can be pivoted about a vertical axis of rotation. Arranged on the free front side of the robot arm is a wafer holder which has holding arms which are provided with vacuum suction holders. These holding arms are able to grip the semiconductor wafer and move it in or out of a processing station or a wafer magazine, by the robot arm positioning its wafer holder directly under the underside or rear side of the semiconductor wafer by means of the robot drive and bringing it into contact. After that, the holding arms have a vacuum applied to them, so that the semiconductor wafer is held over the vacuum openings on the upper side of the wafer holder and can be transported from one position to another.

Probers of this type are employed in semiconductor factories, what are known as fabs, as production probers. In this case, these production probers take up a great deal of area, since a large number of such devices is provided. Because of the costs for the fabs, the areas taken up by the production probers are also very costly. Of these areas, large parts of the areas are provided for the production probers, in which engineers or operators can move in order to supply the automatic test systems continuously with semiconductor wafers to be tested.

Fully automatic test systems permit the operator or engineer to put in some wafer magazines and, with an initial setting made once, to operate until all the semiconductor wafers have been tested. A fully automatic test system of this type contains, in addition to the actual test arrangement, which substantially comprises a chuck, chuck driver, control electronics, probe or probe board and appropriate holding and connecting means, a pattern recognition system for wafer self-adjustment, CCD camera or microscope for observing the test substrate, monitor, handling system, wafer magazine station and alignment station.

It is, then, an object of the invention to reduce the space required and the costs which arise with the testing of substrates, in particular semiconductor wafers, during the production process.

SUMMARY OF THE INVENTION

Inventive testing apparatus including testing arrangements which reduce the space required and the costs which arise with the testing of substrates, are provided. The testing arrangements provided include at least two testing arrangements that are jointly operatively connected to the handling system and the substrate alignment station.

Therefore, via a substrate magazine station, a wafer magazine can be employed by which all the test arrangements are then supplied with semiconductor wafers for testing. In this case, the handling system removes a semiconductor wafer from the wafer magazine, places the same wafer on the alignment station for the purpose of pre-positioning. Following pre-positioning, the semiconductor wafer is picked up again and supplied to a test arrangement.

This has several advantages. Firstly, the handling system, substrate magazine station and alignment station can be used for a plurality of test arrangements, whereas, in the prior art, this equipment had to be provided in each test arrangement. This reduces the expenditure on the production of test apparatuses. Secondly, the capacity of the aforementioned stations can be utilized fully, since the handling and pre-adjustment times are small as compared with the testing time. Thirdly, various test methods, for example high-temperature or low-temperature measurement, high-speed measurement and measurement with high accuracy can be implemented on one and the same apparatus without the substrates having to be transported by an operator or engineer. Finally, in accordance with the object, the space required by test arrangements also decreases since, on one hand, less space is needed for the test arrangements themselves and, on the other hand, the area for the access of an operator or engineer to a test arrangement no longer has to be provided for each test arrangement.

In one embodiment of the invention, provision is made for each test arrangement to be constructed as a separate module. Such a module can expediently be constructed in such a way that all the elements which are connected directly with the substrate testing are located in the upper region and media supply, control devices and the like are located in the lower region.

Furthermore, it is expedient that the handling system, the substrate magazine station and the alignment station are arranged in a common module. Since these elements have a close operational relationship with one another, an optimum connection can be achieved with such a modular design, since such a module can be constructed and tested separately and then used completely on site.

Furthermore, it is beneficial that each module has the same basic grid dimensions and each module can be connected to each other. Therefore, a cluster can be constructed in accordance with the building block principle, the effort involved in mounting being reduced to a minimum.

In a further refinement of the invention, provision is made for a module to be designed such that it can be moved and locked in its erection position. Therefore, for example for maintenance and repair work, it is possible to remove a test arrangement from the cluster while the other test arrangements in the cluster can continue to operate. As a result of the ability to move, which, for example, can be implemented by means of rollers on the standing surface, very easy transport is possible, while inadvertent displacement in the erection position can be ruled out.

It is beneficial to have the apparatus appear as a single subassembly, by a common housing being provided, into which the test arrangements, the handling system, the wafer magazine system and the alignment station are introduced. Therefore, first of all a separate housing for each subassembly is saved. Secondly, it is therefore possible even to subject the entire apparatus with a plurality of test arrangements to a particular climate or particular environmental conditions. Thus thee is, for example, the possibility of common electromagnetic screening Since every mechanical movement causes vibrations, it is beneficial to arrange each module on a vibration insulating, preferably position-controlled, platform. This firstly achieves the situation where mechanical vibrations produced by the apparatus are not transmitted to other arrangements. Secondly, this achieves a situation where mechanical vibrations of any sort which could have a detrimental effect on the observation or test results during testing are not introduced from outside.

It is particularly expedient in this case that each module is arranged on a separate platform from the other modules. It is therefore also possible to avoid vibrations being transmitted from one test arrangement to another.

In order to improve the ability to reach them and in order to reduce the movement distances, it is advantageous that all the test arrangements are arranged to form a central free space in plan view and the handling system and/or the alignment station is/are arranged in the central free space.

In a further refinement of the invention, provision is made for more than two test arrangements to be provided, of which the number going beyond two can be removed. This achieves the situation where, with test operation continuing to run, one or more test arrangements can be removed and made available to maintenance or other apparatuses, for example to expand the capacity.

Finally, in a further refinement of the invention, provision is made for at least one test arrangement to have additional equipment. This additional equipment can be seen in microscopes, including stereo microscopes, thermal chucks with hot and cold temperature control, light-tight covers, electromagnetic or gas-sealing chambers, laser cutting devices, emission cameras and so on, by which means one or more test arrangements can be configured individually for various purposes.

BRIEF DESCRIPTION OF THE DRAWINGS

Further features of the invention, its nature, and various advantages will be more apparent from the following detailed description of the preferred embodiments and the accompanying drawings, wherein like reference characters represent like elements throughout, and in which:

FIG. 1 shows a plan view of an apparatus according to the invention for testing semiconductor wafers, having two test arrangements;

FIG. 2 shows a plan view of an apparatus according to the invention for testing semiconductor wafers, having four test arrangements;

A listing of the reference characters and the corresponding elements shown in FIGS. 1–4 is provided below:

Figure 3:
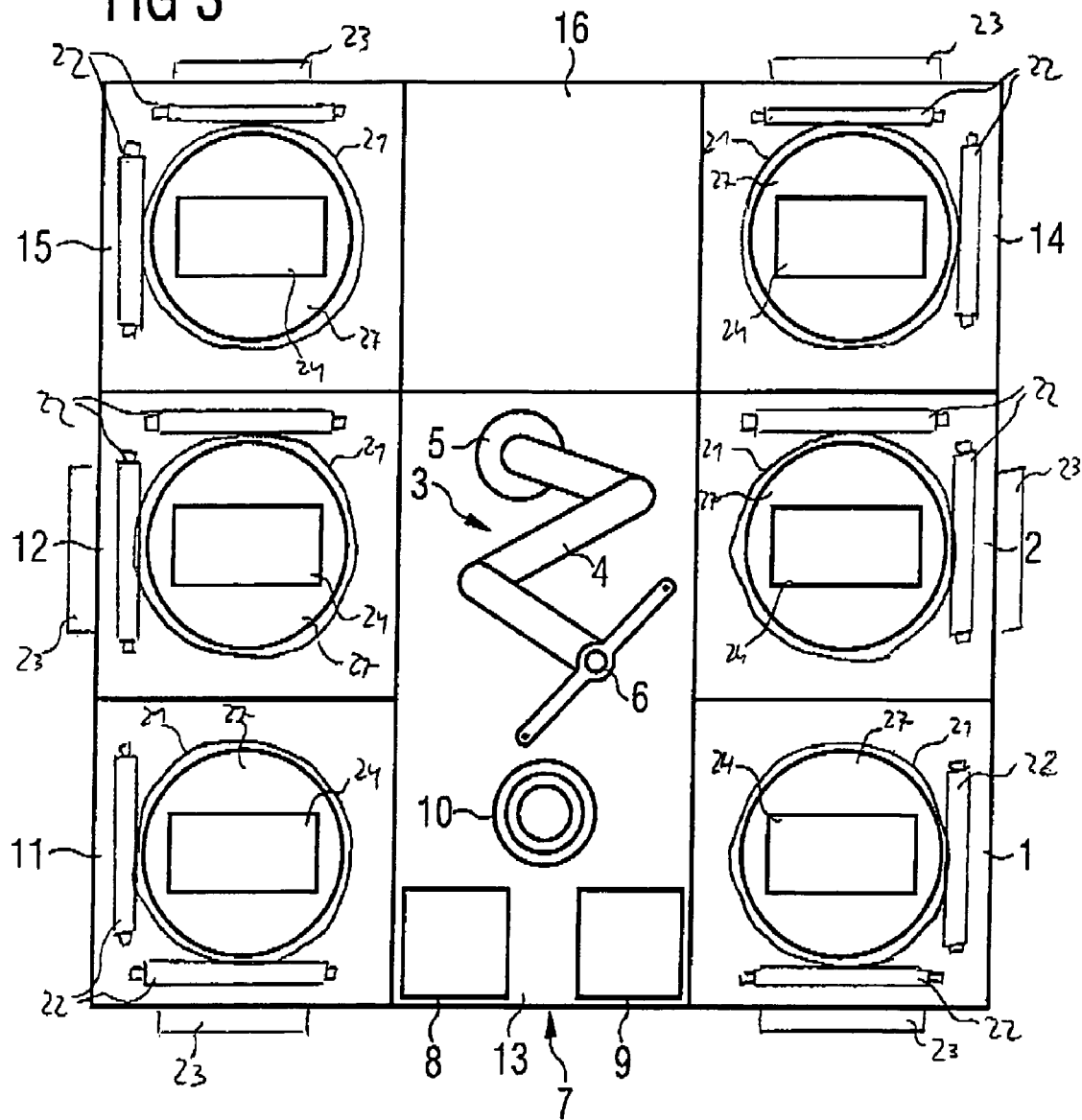
FIG. 3 shows a plan view of an apparatus according to the invention for testing semiconductor wafers, having six test arrangements.

1 First test arrangement
2 Second test arrangement
3 Handling sys tern
4 Robot arm
5 Robot drive
6 Wafer holder
7 Wafer magazine station
8 Input wafer magazine
9 Output wafer magazine
10 Alignment station
11 Third test arrangement
12 Fourth test arrangement
13 Central free space
14 Fifth test arrangement
15 sixth test arrangement
16 Expansion module
17 Housing
18 Housing door
19 operator entry
20 Free region
21 Chuck
22 chuck drive
23 control electronic
24 probe board holding mean
25 platform
26 bellows
27 wafer
28 probe

DESCRIPTION OF THE INVENTION

As illustrated in FIG. 1 a first test arrangement 1 and a second test arrangement 2 are provided, which are in each case constructed modularly such that their external dimensions are subject to the same grid dimension and are identical to each other in the present exemplary embodiment. It therefore becomes possible to place the two test arrangements 1 and 2 close beside each other and to connect them to each other.

Arranged laterally beside the row of test arrangements 1 and 2 is a handling system 3. The handling system 3 includes a robot arm 4 which is attached to a robot drive 5. Arranged on the free front side of the robot arm 4 is a wafer holder 6, by means of which an underside of a semiconductor wafer I not specifically illustrated, can be picked up and attracted by suction by means of vacuum.

Also provided is a wafer magazine station 7, into which an input wafer magazine 8 and an output wafer magazine 9 can be inserted.

An alignment station 10 is provided between the wafer magazine station 7 and the handling system 3.

The function of the apparatus can now be seen in the fact that, by means of the wafer holder 6, a semiconductor wafer is removed from the input wafer magazine 8 and temporarily deposited on the alignment station 10. In this alignment station 10, the position of the semiconductor wafer is adjusted, in order that the latter then has a correct positional orientation when inserted into one of the test arrangements 1 or 2 and only has to be adjusted finely in the test arrangement 1 or 2. Then, under the control of the robot arm 4 and the robot dive, the semiconductor wafers are transferred into one of the test arrangements 1 or 2. Which of the test arrangements 1 or 2 is loaded is determined via a control program.

As illustrated in FIG. 2, a third test arrangement 11 and a fourth test arrangement 12 are provided, which are arranged symmetrically with respect to the centre of the apparatus. Therefore, the handling system 3, the alignment station 10 and the wafer magazine station 7 are located in the central free space 13 apparatus which is visible in the plan view.

As illustrated in FIG. 3, a fifth test arrangement 14 and a sixth test arrangement 15 are provided. All the test arrangements 1, 2, 11, 12, 14 and 15 are in this case arranged in such a way that the central free space 13 remains available for the arrangement of the handling system 3 and the alignment station 10.

In this arrangement, space is also provided for an expansion module 16 where, optionally, another test station or another module, for example an intermediate storage module or a second wafer magazine station, can be arranged.

Figure 4:
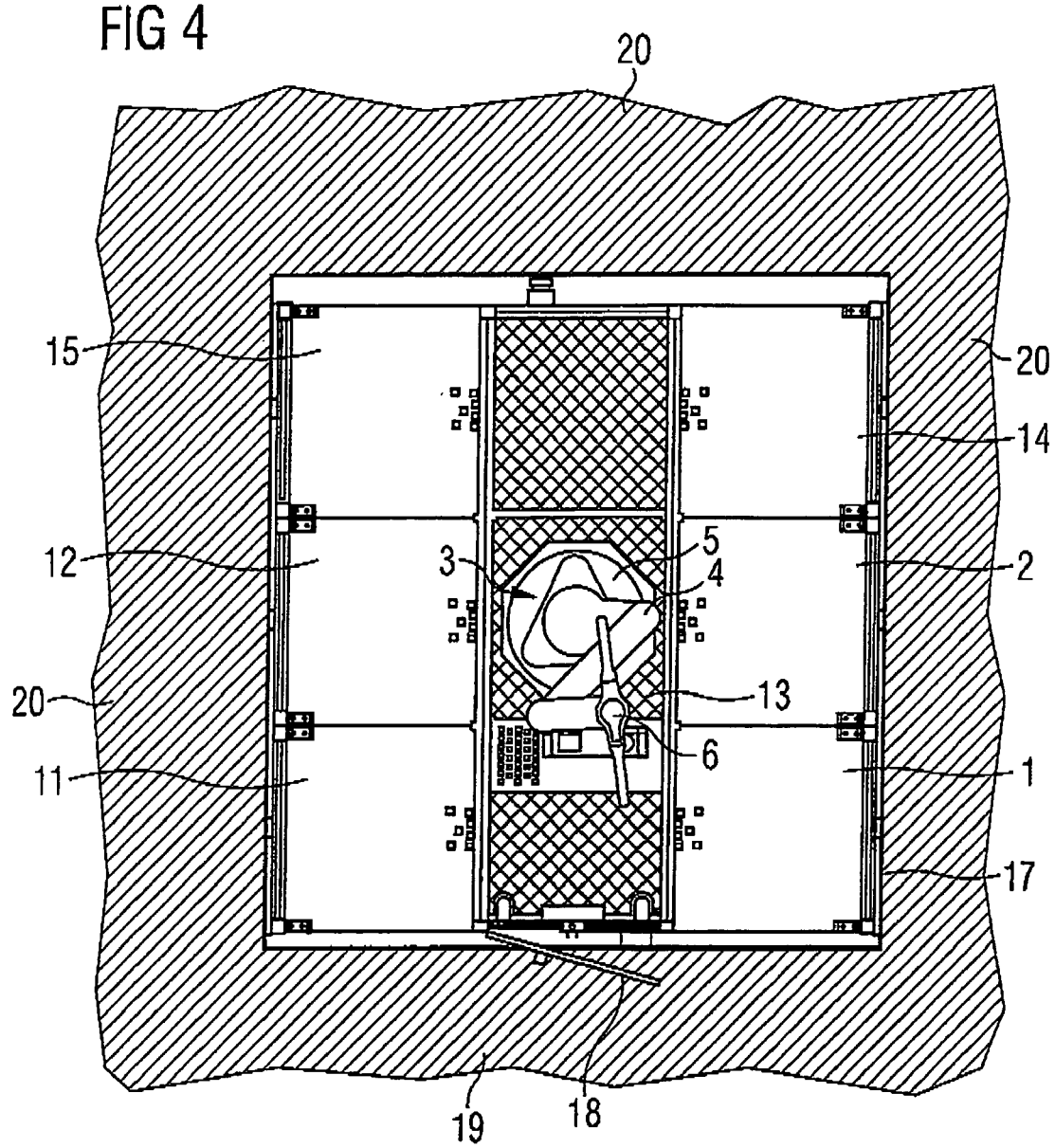
FIG. 4 shows a plan view of an apparatus according to the invention for testing semiconductor wafers in a production environment.

Illustrated in FIG. 4 is an apparatus having test arrangements 1, 2, 11, 12, 14 and 15. The entire apparatus has a common housing 17, which is provided with a housing door 18 only on the side of the wafer magazine station 7. Through this housing door, the wafer magazines 8 and 9, which are not specifically illustrated in FIG. 4, can be operated. An operator entry 19 is provided only for this operation. The other free regions 20 are not needed, so that the space required, which is small in any case, could be reduced still further.

Figure 5:
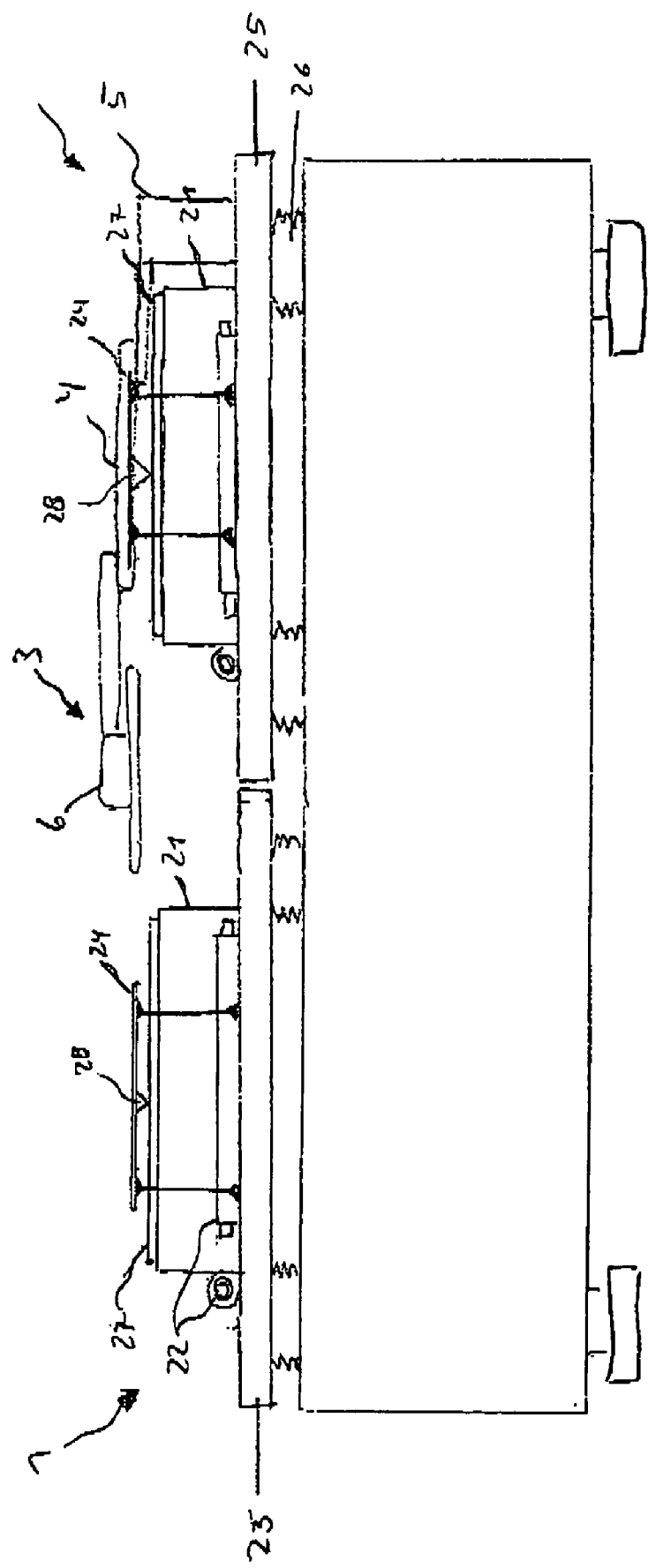
FIG. 5 shows a lateral view of an apparatus according to the invention for testing semiconductor wafers comprising elements for vibrations-insulation.

Each test arrangements 1, 2 of an embodiment of the invention shown in FIG. 5 is arranged on separate platforms 25. Both platforms are elastically supported by respective spring bellows 26 that prevent or reduce vibrations being transmitted from the other test arrangement or from the environment of the apparatus.

All the test arrangements 1, 2, 11, 12, 14 and 15 are able to implement the same or different functions, such as the testing and temperature influence, high-speed testing, highly accurate testing or testing under particular environmental conditions, depending on the application and the area of use.

The invention claimed is:

1. An apparatus for electrical testing of finished devices or circuits fabricated on substrates, the apparatus comprising shareable components namely a shareable handling system, a shareable substrate magazine station and shareable alignment station, and at least two electrical test arrangements for electrical testing of the finished devices or circuits fabricated on substrates, each test arrangement comprising a chuck, a chuck drive, control electronics, probe or probe board holding means, wherein the at least two electrical test arrangements are all jointly operatively connected to the shareable handling system, the shareable substrate magazine station and the shareable alignment station, so that substrate handling for the at least two electrical test arrangements is provided exclusively by a common shareable component which is connected to both electrical test arrangements.

2. The apparatus according claim 1, characterized in that the shareable handling system, the shareable substrate magazine station and the shareable alignment station are arranged in a common module which is less than a whole of the apparatus for electrical testing of devices fabricated on substrates and is connected to the at least two electrical test arrangements.

3. The apparatus according to claim 1, wherein each of the at least two test arrangements is constructed as a separate module.

4. The apparatus according claim 3 further characterized in that each separate module has the same basic grid dimensions and each separate module can be connected to each other.

5. The apparatus according claim 3 further characterized in that each separate module is designed such that it can be moved and locked in an operational position.

6. The apparatus according claim 3 further characterized in that each separate module is arranged on a vibration-insulating, preferably position-controlled platform.

7. The apparatus according claim 6 further characterized in that each separate module is arranged on a separate platform from the other modules.

8. The apparatus according claim 6 further characterized in that a common housing is provided, into which the test arrangements, the shareable handling system, the shareable substrate magazine station and the shareable alignment station are housed.

9. The apparatus according claim 1 further characterized in that all the test arrangements are arranged around at least one of the shareable handling system and the shareable alignment station.

10. The apparatus according claim 1 further comprising a removable test arrangement.

11. The apparatus according claim 1 further characterized in that at least one test arrangement further comprises additional equipment.

* * * * *